United States Patent
Jeong (10) Patent No.: US 8,895,968 B2
(45) Date of Patent: Nov. 25, 2014

(54) ORGANIC LIGHT EMITTING DISPLAY DEVICE AND MANUFACTURING METHOD THEREOF

(71) Applicant: LG Display Co., Ltd, Seoul (KR)

(72) Inventor: Yun-Sik Jeong, Busan (KR)

(73) Assignee: LG Display Co., Ltd., Seoul (KR)

( * ) Notice: Subject to any disclaimer, the term of this patent is extended or adjusted under 35 U.S.C. 154(b) by 75 days.

(21) Appl. No.: 13/672,914

(22) Filed: Nov. 9, 2012

(65) Prior Publication Data
US 2013/0168648 A1 Jul. 4, 2013

(30) Foreign Application Priority Data
Dec. 30, 2011 (KR) .................. 10-2011-0147055

(51) Int. Cl.
  H01L 27/00 (2006.01)
  H01L 51/00 (2006.01)
  H01L 27/32 (2006.01)
  H01L 51/52 (2006.01)
(52) U.S. Cl.
  CPC ......... *H01L 27/3225* (2013.01); *H01L 51/5237* (2013.01); *H01L 27/3258* (2013.01); *H01L 51/0017* (2013.01)
  USPC ............. 257/40; 257/E27.119; 257/E51.018; 438/23
(58) Field of Classification Search
  USPC ............... 257/40, E27.119, E51.018; 438/23
  See application file for complete search history.

(56) References Cited

U.S. PATENT DOCUMENTS

| | | |
|---|---|---|
| 2006/0113900 A1 | 6/2006 | Oh |
| 2012/0169217 A1* | 7/2012 | Kim et al. ............. 313/504 |
| 2013/0009162 A1 | 1/2013 | Kang |

OTHER PUBLICATIONS

Search Report issued in counterpart United Kingdom Patent Application No. 1221907.7 dated Mar. 25, 2013.

* cited by examiner

*Primary Examiner* — Victor A Mandala
(74) *Attorney, Agent, or Firm* — Morgan, Lewis & Bockius LLP

(57) ABSTRACT

An organic light emitting display device wherein organic and inorganic films are alternately stacked, and the inorganic film is patterned to form an outgassing route, through which gas is released from the organic film, and a manufacturing method thereof is herein.

17 Claims, 10 Drawing Sheets

CELL DRIVE UNIT   CELL DRIVE UNIT

ORGANIC LIGHT EMITTING DISPLAY DEVICE AND MANUFACTURING METHOD THEREOF

This application claims the benefit of Korean Patent Application No. 10-2011-0147055, filed on Dec. 30, 2011, which is hereby incorporated by reference as if fully set forth herein.

BACKGROUND OF THE INVENTION

1. Field of the Invention

The present invention relates to an organic light emitting display device and a manufacturing method thereof, and more particularly, to an organic light emitting display device wherein organic and inorganic films are alternately stacked, and the inorganic film is patterned to form an outgassing route, through which gas is released from the organic film, and a manufacturing method thereof.

2. Discussion of the Related Art

An image display device realizing various kinds of information through a screen, which is a core technology in information communication, has been developed such that the image display device is thinner, lighter, portable, and high-performance. An organic light emitting display device that controls the amount of light emitted from an organic light emitting layer to display an image has been spotlighted as a flat panel display device, the weight and volume of which are less than those of a cathode ray tube.

The organic light emitting display device is a self emitting device using a thin light emitting layer between electrodes and has an advantage in that the organic light emitting display device can be thinned like paper. The organic light emitting display device may be classified as an active matrix type organic light emitting display device that can be selectively driven by a cell drive unit of each pixel or a passive matrix type organic light emitting display device that can be controlled for each line.

In the active matrix type organic light emitting display device (AMOLED), pixels expressing three colors (R, G, and B) are arranged in a matrix pattern to display a picture. Each pixel includes an organic light emitting diode (OLED) and a cell drive unit to drive the organic light emitting diode. The cell drive unit, including at least two thin film transistors connected between a gate line to supply a scan signal, a data line to supply a video data signal, and a common power line to supply a common power signal, drive an anode of the organic light emitting diode.

The organic light emitting diode includes an anode, hole injection layer (HIL), hole transport layer (HTL), light emitting layer, electron transport layer (ETL), electron injection layer (EIL), and a cathode.

Meanwhile, the organic light emitting display device is configured by depositing an inorganic insulating film to protect a thin film transistor array, an organic planarization film to planarize the inorganic insulating film, and an inorganic insulating film to stabilize the surface before formation of the organic light emitting diode or having an optical compensation function. During driving of the organic light emitting display device for a long period of time, outgassing occurs from the organic film between the inorganic insulating films.

When gas remains in the organic film, however, the diode is deteriorated with the result that a shrinkage phenomenon, in which the size of each pixel is reduced, is accelerated, which may fatally affect the lifespan of the diode.

The conventional organic light emitting display device as described above has the following problems.

In the structure in which the organic and inorganic films are alternately stacked, tight contact at the interface between the organic and inorganic films is low with the result that outgassing may occur in the organic film during reliability testing or driving for a long period of time.

During outgassing, gas may remain in the organic film to deteriorate the diode and to accelerate a shrinkage phenomenon in which the size of the diode is reduced over time, by which the lifespan of the diode is greatly reduced.

SUMMARY OF THE INVENTION

Accordingly, the present invention is directed to an organic light emitting display device and a manufacturing method thereof that substantially obviate one or more problems due to limitations and disadvantages of the related art.

Various embodiments provide an organic light emitting display device wherein organic and inorganic films are alternately stacked, and the inorganic film is patterned to form an outgassing route, through which gas is released from the organic film, and a manufacturing method thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In various embodiments, an organic light emitting display device is provided. The organic light emitting display device may include: a cell drive unit having a plurality of pixels on a substrate (e.g. in a matrix) and comprising at least one transistor (e.g. a thin film transistor) between the respective pixels; an insulating stack unit including an organic film and an inorganic film formed one above the other on the substrate in a region of the cell drive unit; wherein the inorganic film of the insulating stack unit corresponding to the cell drive unit is patterned to form an outgassing route; and an organic light emitting diode connected to the cell drive unit through the insulating stack unit.

In various embodiments, the organic light emitting display device may further include: a bank formed on the insulating stack unit in a region of the outgassing route.

In various embodiments, the bank contacts the organic film of the insulating stack unit through the outgassing route.

In various embodiments, the organic light emitting display device may further include a further organic film, wherein the patterned inorganic film is arranged between the organic film and the further organic film, wherein the organic film and the further organic film contact each other through the outgassing route.

In various embodiments, the organic film of the insulating stack unit includes any one selected from among a black matrix layer, a color filter layer, a planarization film, and an interlayer.

In various embodiments, the organic film of the insulating stack unit includes at least one material selected from among polyimide, polyamide, acryl resin, color pigment material, and black resin material.

In various embodiments, the patterned inorganic film is patterned to form one or more outgassing routes in the same layer of the inorganic film.

In various embodiments, the organic light emitting display device may further include at least one further inorganic layer, wherein the inorganic layer and the further inorganic layer are patterned to form one or more outgassing routes in different inorganic films.

In various embodiments, the inorganic film of the insulating stack unit is formed of a nitride, oxide, or oxynitride.

In various embodiments, the organic light emitting diode includes: a first electrode connected to the cell drive unit through the insulating stack unit so that the first electrode is formed at each of the pixels; an organic light emitting layer formed on the first electrode; and a second electrode formed on the organic light emitting layer.

In various embodiments, a manufacturing method of an organic light emitting display device may include: forming a cell drive unit having a plurality of pixels in a matrix pattern and comprising at least one transistor between the respective pixels on a substrate; forming at least one insulating stack unit on the substrate in the region of the cell drive unit by stacking an organic film and an inorganic film one above the other; patterning the inorganic film of the insulating stack unit corresponding to the cell drive unit to form an outgassing route; and forming an organic light emitting diode connected to the cell drive unit through the insulating stack unit.

In various embodiments, the manufacturing method may further include forming a bank on the insulating stack unit in a region comprising the outgassing route.

In various embodiments, the step of forming the insulating stack unit and the step of forming the outgassing route may include: forming a first organic film on the substrate in a region of the cell drive unit; forming a first inorganic film on the first organic film; and patterning the first inorganic film corresponding to the cell drive unit to form a first outgassing route.

In various embodiments, when the first inorganic film is patterned to form the first outgassing route, even a thickness portion of first organic film under the first inorganic film may be over-etched.

In various embodiments, the manufacturing method may further include forming a second organic film on the first inorganic film comprising the first outgassing route.

In various embodiments, the manufacturing method may further include forming a second inorganic film on the second organic film and patterning the second inorganic film to form a second outgassing route.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
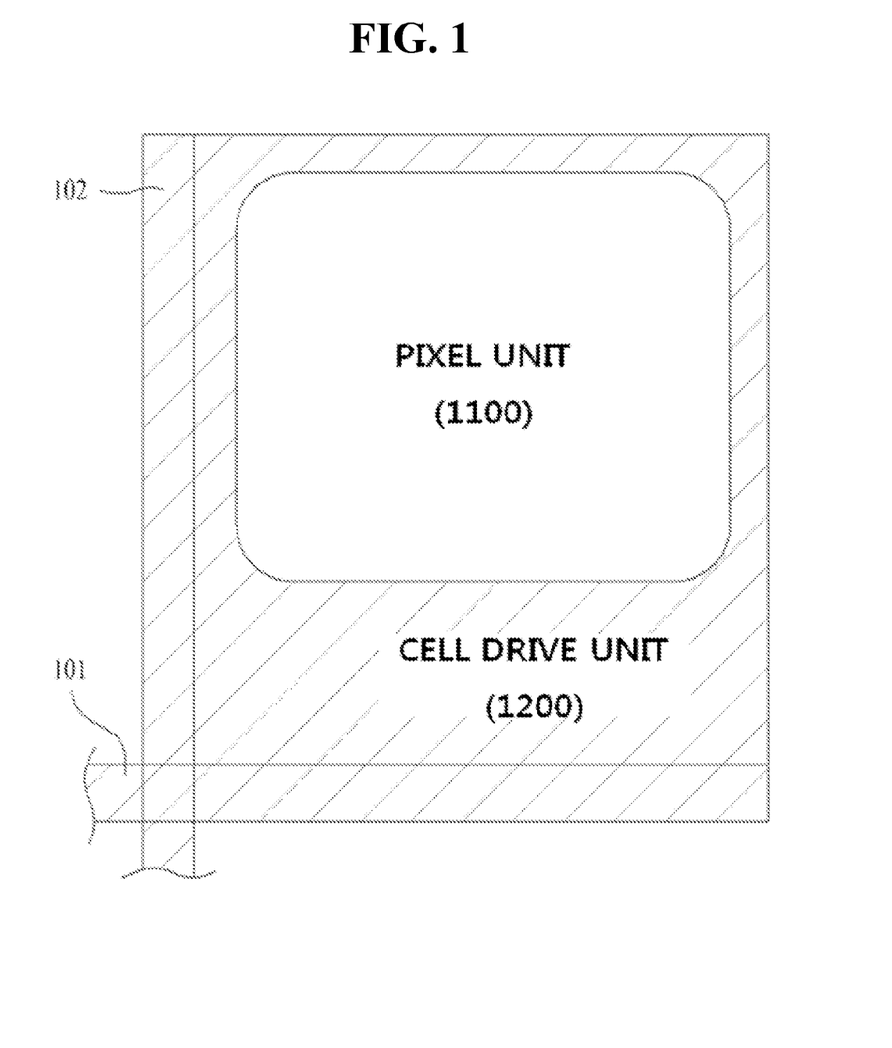
FIG. 1 is a plan view showing a pixel of an organic light emitting display device according to the present invention.

FIG. 1 is a plan view showing a pixel of an organic light emitting display device according to the present invention.

In the organic light emitting display device according to the present invention as shown in FIG. 1, a pixel region is defined by a gate line 101 and a data line 102. A pixel unit 1100 including an organic light emitting diode is defined in the pixel region, and a cell drive unit 1200 to drive the pixel unit 1100 is defined in the vicinity of the pixel unit 1100.

Structurally, the cell drive unit 1200 is a region at which a bank (not shown, see 160 of FIG. 2) to divide the pixel unit 1100. In addition to the gate line 101 and the data line 102, at least one thin film transistor and a drive power line are formed at the cell drive unit 1200. Also, one of the thin film transistors, i.e. a drive thin film transistor, is connected to a first electrode (anode) of the organic light emitting diode.

In the organic light emitting display device according to the present invention, organic and inorganic films are alternately disposed in at least one pair, in which a part of the inorganic film corresponding to the cell drive unit 1200 is removed by patterning to form an outgassing route, thereby preventing gas from remaining in the organic film. As a result, gas is released through the outgassing route although outgassing occurs in the organic film during driving or reliability testing. Particularly, the gas is not released to the pixel unit 1100 but is guided to the cell drive unit 1200, thereby preventing shrinkage of the pixel unit 1100.

Hereinafter, an outgassing principle of the organic light emitting display device according to the present invention will be described in detail.

Figure 2:
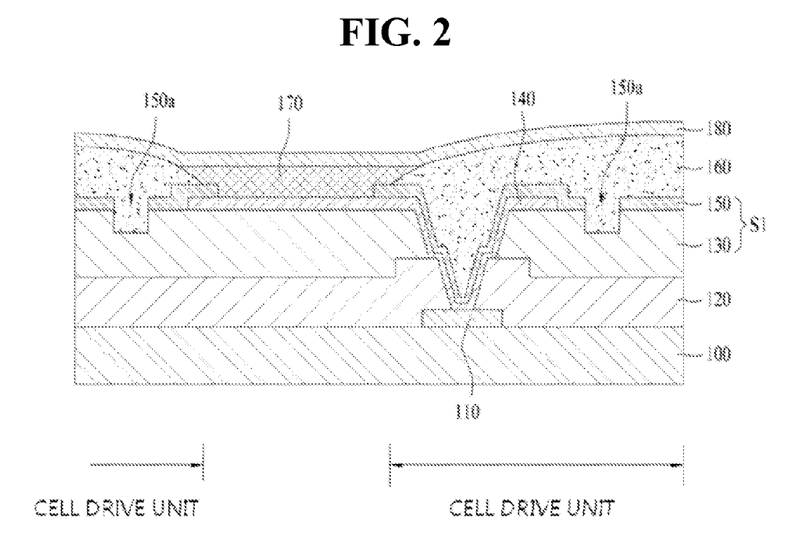
FIG. 2 is a sectional view showing a first embodiment of the organic light emitting display device according to the present invention.

FIG. 2 is a sectional view showing a first embodiment of the organic light emitting display device according to the present invention.

In the first embodiment of the organic light emitting display device according to the present invention shown in FIG. 2, the lower construction of a cell drive unit formed on a substrate 100 excluding a drain electrode 110 of a drive thin film transistor is omitted for simplicity.

As shown in FIG. 2, the first embodiment of the organic light emitting display device according to the present invention includes a cell drive unit having a plurality of pixels on a substrate 100 in a matrix pattern and including at least one thin film transistor (a switching thin film transistor may be included in addition to a drive thin film transistor) between the respective pixels, an insulating stack unit S1 formed by alternately stacking an organic film 130 and an inorganic film 150 on the substrate 100 including the cell drive unit at least once, an outgassing route 150a formed by patterning the inorganic film 150 of the insulating stack unit S1 (e.g. thereby forming one or more holes, e.g. through holes through the inorganic film 150) corresponding to the cell drive unit, a bank 160 formed on the insulating stack unit S1 including the outgassing route 150a, and an organic light emitting diode (OLED) connected to the cell drive unit through the insulating stack unit S1.

The organic light emitting diode (OLED) includes a first electrode 140 connected to the cell drive unit through the insulating stack unit S1 and a passivation film 120 under the insulating stack unit S1 so that the first electrode 140 is formed at each of the pixels, an organic light emitting layer 170 formed on the first electrode 140, and a second electrode 180 formed on the organic light emitting layer 170. The organic light emitting layer 170 is formed at each pixel, for example, between the banks 160. The organic light emitting layer 170 may include a red light emitting layer, a green light emitting layer, and a blue light emitting layer.

Between the organic light emitting layer 170 and the first electrode 140 and between the organic light emitting layer 170 and the second electrode 180 may be further formed a hole transport layer or an electron transport layer.

Meanwhile, the outgassing route 150a is formed by removing a thickness portion of the organic film 130 as well as the inorganic film 150 of the insulating stack unit S1. However, this phenomenon occurs due to over-etching during patterning of the inorganic film 150, and therefore, the present invention is not limited thereto. An etching rate and etching gas may be adjusted to selectively pattern only the inorganic film 150 to expose a surface portion of the organic film 130.

The outgassing route 150a functions as a passage through which the organic film 130 of the insulating stack unit S1 directly (in other words physically) contacts the bank 160, which is formed of an organic material. That is, when outgassing occurs in the organic film 130 of the insulating stack unit S1, gas is released through the outgassing route 150a, thereby preventing deterioration of the pixel unit due to the gas.

Figure 2A:
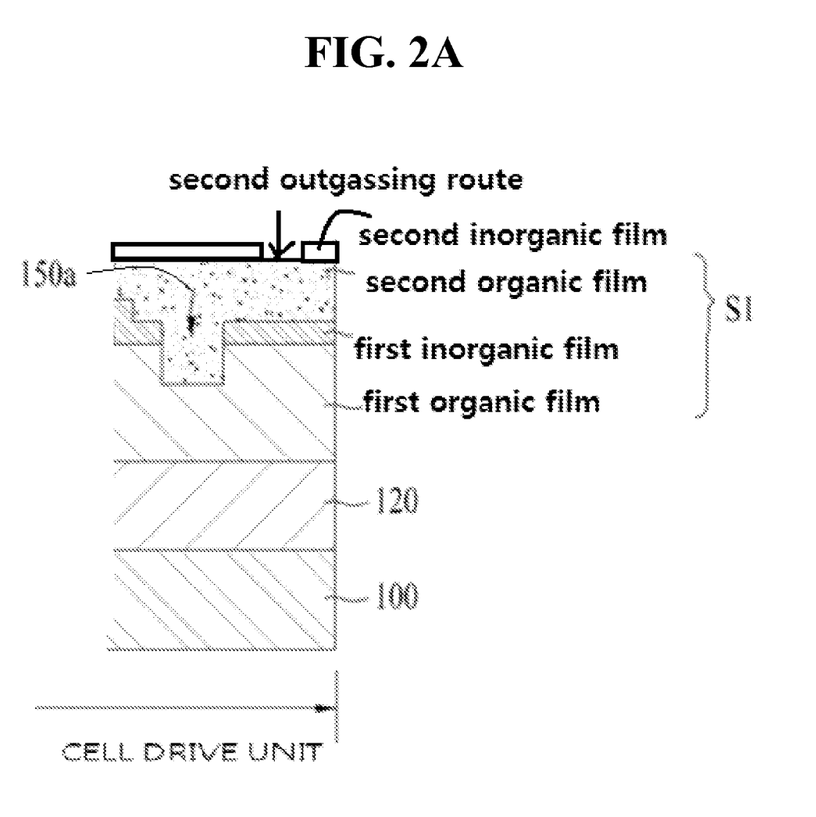
FIG. 2A is a sectional view showing a variation of the first embodiment.

In this embodiment, a layer of organic film and a layer of inorganic film are stacked; however, the present invention is not limited thereto. A plurality of organic films and a plurality of inorganic films may be alternately stacked, as shown in FIG. 2A. In this case, the outgassing route may be formed at different inorganic films at predetermined regions corresponding to the cell drive unit so that gas can be smoothly released through the outgassing route. In this case, the organic films on and under the patterned inorganic film of the insulating stack unit S1 contact each other through the outgassing route.

For example, the organic film 130 of the insulating stack unit S1 may be any organic film excluding the organic light emitting layer included in the organic light emitting display device. For example, the organic film 130 of the insulating stack unit S1 may be a planarization film, an interlayer insulating layer, or an organic film added for a specific function. The organic film 130 of the insulating stack unit S1 may include at least one selected from among polyimide, polyamide, acryl resin, color pigment material, and black resin material.

Also, one or more outgassing routes 150a may be formed in the same layer of inorganic film 150.

Also, the inorganic film 150 of the insulating stack unit S1 may be formed of a nitride (e.g. silicon nitride), oxide (e.g. silicon oxide), or oxynitride (e.g. silicon oxynitride).

Figure 3:
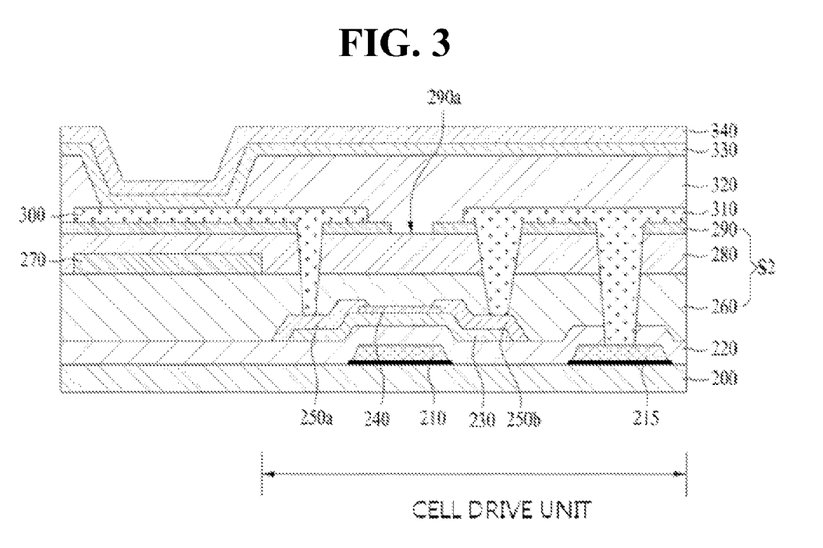
FIG. 3 is a sectional view showing a second embodiment of the organic light emitting display device according to the present invention.

FIG. 3 is a sectional view showing a second embodiment of the organic light emitting display device according to the present invention.

The second embodiment of the organic light emitting display device according to the present invention shown in FIG. 3 is different from the first embodiment of the organic light emitting display device according to the present invention shown in FIG. 2 in that an organic light emitting layer is not formed at each pixel, white light emission is generally achieved, and a color filter layer is provided at a lower array side to achieve color display.

That is, as shown in FIG. 3, the second embodiment of the organic light emitting display device according to the present invention includes a cell drive unit having a plurality of pixels on a substrate 200 in a matrix pattern and including at least one thin film transistor (a switching thin film transistor may be included in addition to a drive thin film transistor) between the respective pixels, an insulating stack unit S2 including an inorganic passivation film 260, an organic planarization film 280, and an optical compensation inorganic film 290 formed on the substrate 200 including the cell drive unit, an outgassing route 290a formed by patterning the optical compensation inorganic film 290 of the insulating stack unit S2 corresponding to the cell drive unit, a bank 320 formed on the insulating stack unit S2 including the outgassing route 290a, and an organic light emitting diode (OLED) connected to the cell drive unit through the insulating stack unit S2. Herein, the inorganic passivation layer 260 is made of inorganic material such as SiOx, SiNx or a stack of SiOx/SiNx. And a range of thickness of the inorganic passivation layer 260 may be in the range from about 300 nm to about 400 nm. The organic planarization film 280 may be made of organic material such as PI (Polyimide), PA (Poly acryl) or positive photo resistive. And a range of thickness of the organic planarization film 280 is from about 1.5 μm to about 2.5 μm. The optical compensation inorganic film 290 may be made of inorganic material such as SiOx, SiNx or stack of SiOx/SiNx. And a range of thickness of the organic planarization film 280 may be from about 100 nm to about 200 nm or in the range from about 300 nm to about 400 nm. The bank 320 may be made of organic material such as PI (Polyimide) or PA (Poly acryl). And a range of thickness of the organic planarization film 320 may be from about 1.5 μm to about 2.5 μm.

The depth of the outgassing route 290a may be in the range from about 100 nm to about 300 nm.

The drive thin film transistor includes a gate electrode 210 connected to, e.g. protruding from a gate line, a semiconductor layer 230 formed on the gate electrode via a gate insulating film 220 (e.g. forming a body region of the transistor, e.g. thin film transistor), an etch stopper layer 240 formed on the semiconductor oxide layer 230 corresponding to the gate electrode 210, and a drain electrode 250a and source electrode 250b connected to opposite sides of the semiconductor oxide layer 230.

The drain electrode 250a is connected to a first electrode 300 of the organic light emitting diode (OLED) through the insulating stack unit S2. Alternatively, a connection electrode 310 to interconnect the source electrode 250b of the drive thin film transistor and a gate electrode 215 of another thin film transistor may be provided at the same layer of first electrode 300.

In this embodiment, the gate electrodes 210 and 215 formed at the same layer are formed of a dual-layer metal; however, the present invention is not limited thereto. For example, the gate electrodes 210 and 215 formed at the same layer may be formed of a single metal.

Meanwhile, in this embodiment, a color filter layer 270 is formed at the lower array of the organic light emitting diode for each pixel.

In this case, the organic planarization film 280 is formed of the above-mentioned organic film component, and the inorganic passivation film 260 and the optical compensation inorganic film 290 are formed of the above-mentioned inorganic film components. Therefore, a detailed description thereof will be omitted.

The outgassing route 290a functions as a passage through which the organic planarization film 280 of the insulating stack unit S2 directly contacts the bank 320, which is formed of an organic material. That is, when outgassing occurs in the organic planarization film 280 of the insulating stack unit S2, gas is released through the outgassing route 290a, thereby preventing deterioration of the pixel unit due to the gas.

In this embodiment, the inorganic film, organic film, and inorganic film are stacked to constitute the insulating stack unit S2; however, the present invention is not limited thereto. A plurality of organic films and a plurality of inorganic films may be alternately stacked. Even in this case, the outgassing route may be formed at different inorganic films at predetermined regions corresponding to the cell drive unit so that gas can be smoothly released through the outgassing route. In this case, the organic films on and under the patterned inorganic film of the insulating stack unit S2 contact each other at the outgassing route.

That is, the above-mentioned outgassing route may be further formed at the lower inorganic passivation film of the insulating stack unit S2.

For example, the organic film of the insulating stack unit S2 may be any organic film excluding the organic light emitting layer included in the organic light emitting display device. For example, the organic film of the insulating stack unit S2 may be a planarization film, an interlayer insulating layer, a black matrix layer, a color filter layer, or an organic film added for a specific function.

The organic planarization film 280 of the insulating stack unit S2 may include at least one selected from among polyimide, polyamide, and acryl resin.

Hereinafter, a manufacturing method of an organic light emitting display device according to a first embodiment of the present invention will be described.

FIGS. 4A to 4E are sectional views showing a manufacturing method of an organic light emitting display device according to a first embodiment of the present invention.

Figure 4A:
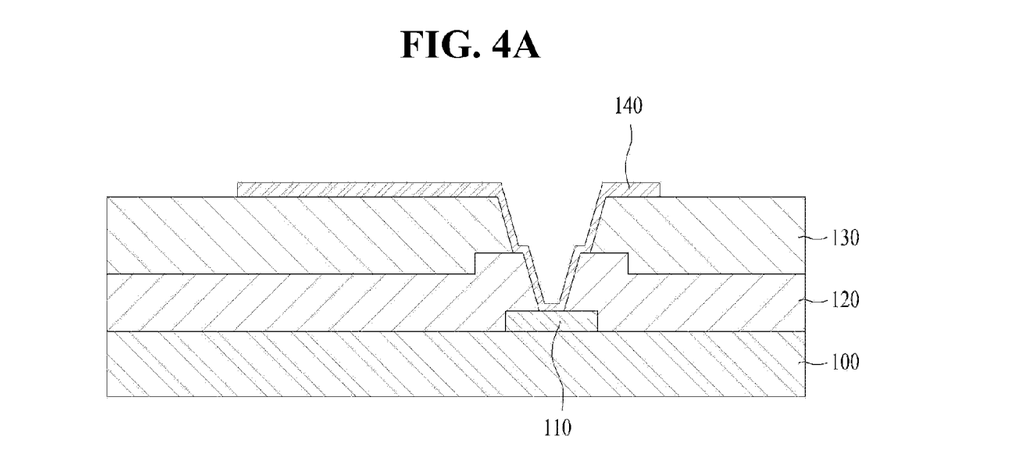
FIGS. 4A to 4E are sectional views showing a manufacturing method of an organic light emitting display device according to a first embodiment of the present invention.

As shown in FIG. 4A, first, a cell drive unit having a plurality of pixels in a matrix pattern and including at least one thin film transistor between the respective pixels is formed on a substrate 100. Reference numeral 110 indicates a drain electrode of a drive thin film transistor.

Subsequently, a passivation film 120 is formed to cover the substrate including the cell drive unit.

The passivation film 120 may be an organic film or an inorganic film. Alternatively, the passivation film 120 may be obtained by sequentially forming an inorganic film and an organic film.

Subsequently, an organic film 130 is formed to cover the passivation film 120 and to planarize the surface of the passivation film 120.

Subsequently, the organic film 130 and the passivation film 120 are etched to form a contact hole so that the drain electrode 110 is exposed, and then a first electrode 140 is formed so that the first electrode 140 is connected to the drain electrode 110 through the contact hole.

Figure 4B:
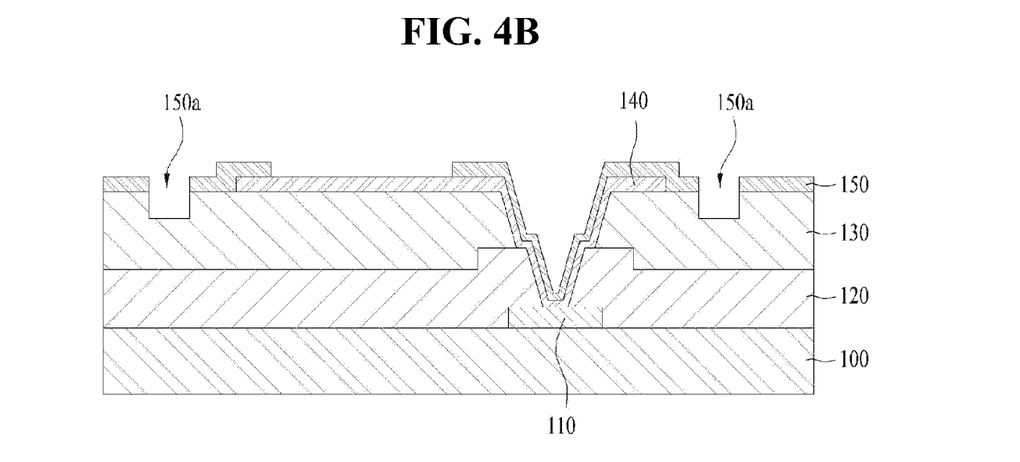

As shown in FIG. 4B, an inorganic film 150 is deposited on the organic film 130 including the first electrode 140, and the inorganic film 150 is selectively removed to form outgassing routes 150a. During etching to form the outgassing routes 150a, thickness portions of the organic film 130 may be etched as shown in the drawing.

Figure 4C:
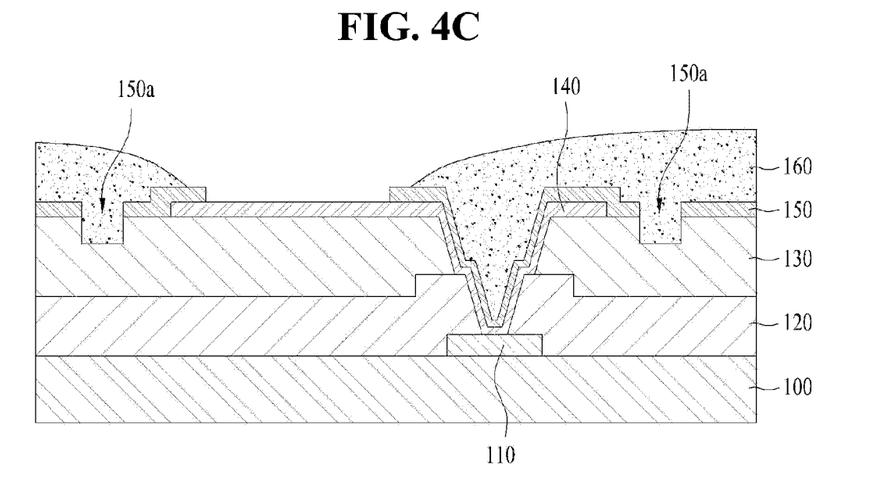

As shown in FIG. 4C, banks 160 are formed at the cell drive unit region on the organic film 130 including the outgassing routes 150a.

Figure 4D:
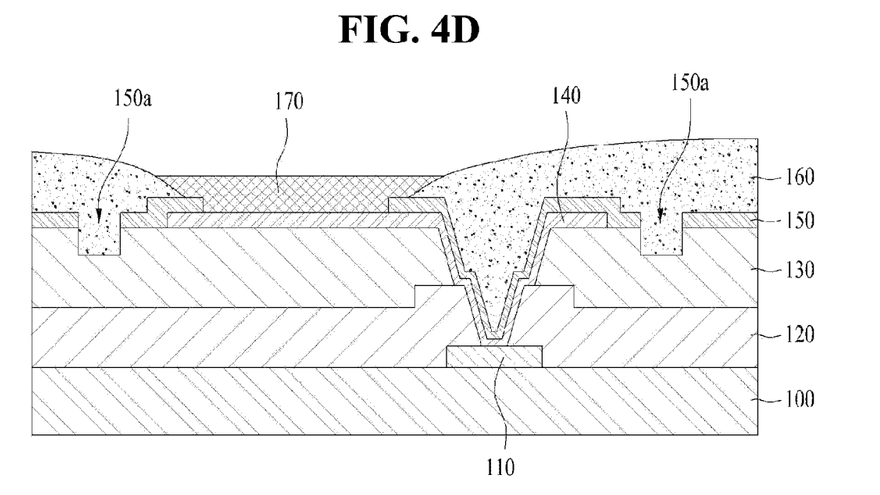

As shown in FIG. 4D, an organic light emitting layer 170, including a red light emitting layer, a green light emitting layer, and a blue light emitting layer, is formed at each pixel unit between the banks 160.

Figure 4E:
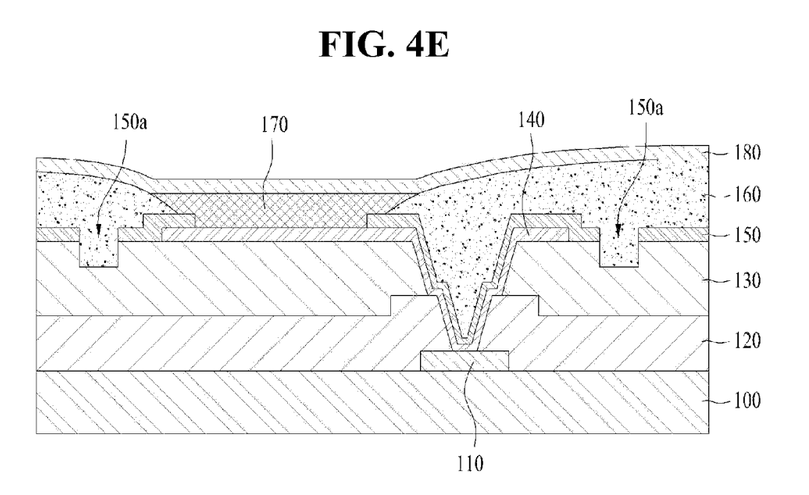

As shown in FIG. 4E, a second electrode 180 is formed at the front.

One of the first and second electrodes 140 and 180 is a transparent electrode, and the other is a reflective electrode.

Hereinafter, a manufacturing method of an organic light emitting display device according to a second embodiment of the present invention will be described.

FIGS. 5A to 5F are sectional views showing a manufacturing method of an organic light emitting display device according to a second embodiment of the present invention.

Figure 5A:
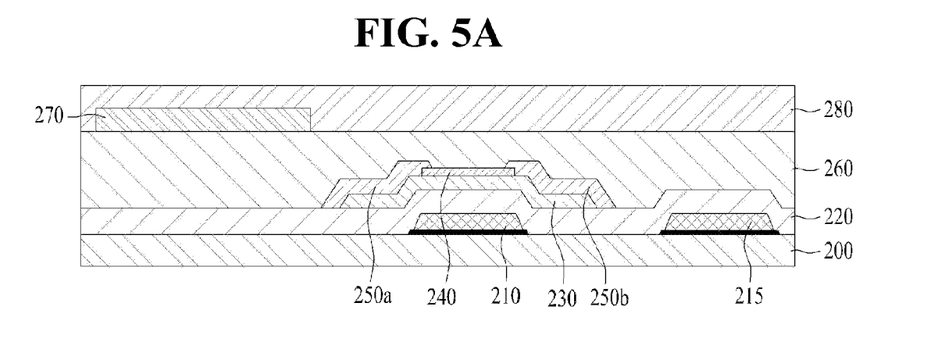
FIGS. 5A to 5F are sectional views showing a manufacturing method of an organic light emitting display device according to a second embodiment of the present invention.

As shown in FIG. 5A, first, a cell drive unit having a plurality of pixels in a matrix pattern and including at least one thin film transistor between the respective pixels is formed on a substrate 200.

The thin film transistor constituting the cell drive unit is formed as follows. A dual-layer metal is stacked on the substrate 200, and the dual-layer metal is selectively removed to form gate electrodes 210 and 215.

Subsequently, a gate insulating film 220 is formed on the substrate 200 so as to cover the gate electrodes 210 and 215.

Subsequently, a semiconductor oxide layer 230 of a predetermined width is formed to cover the gate electrode 210.

Subsequently, an insulating film, such as a nitride film, is patterned to form an etch stopper layer 240 on the semiconductor oxide layer 230 corresponding to the gate electrode 210.

Subsequently, a metal is deposited and selectively patterned to form a drain electrode 250a and source electrode 250b, which are spaced apart from each other. The drain electrode 250a and source electrode 250b are formed at the same layer as a data line (not shown, see 102 of FIG. 1). The source electrode 250b may be formed integrally with the data line.

Subsequently, an inorganic passivation film 260 is formed to cover the substrate including the cell drive unit.

Subsequently, an organic planarization film 280 is formed to cover the inorganic passivation film 260 and to planarize the surface of the inorganic passivation film 260.

Figure 5B:
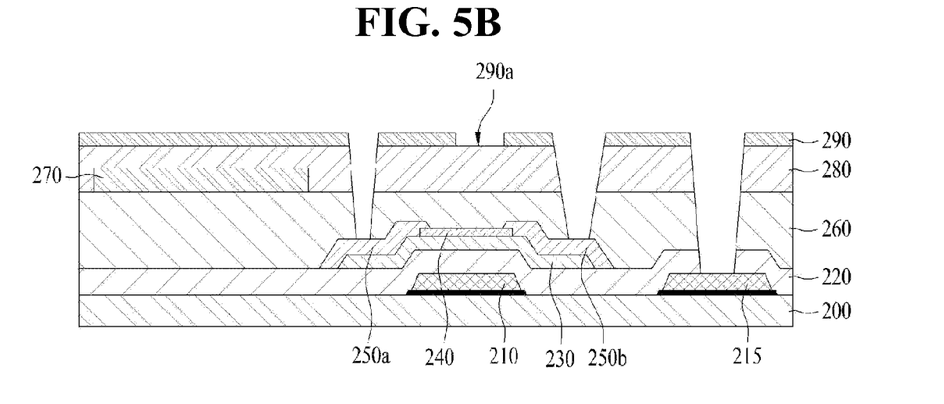

As shown in FIG. 5B, an optical compensation inorganic film 290 is deposited on the organic planarization film 280, and then the optical compensation inorganic film 290, the organic planarization film 280, and the inorganic passivation film 260 are selectively etched using a half tone mask or a diffraction exposure mask.

During etching, the optical compensation inorganic film 290, the organic planarization film 280, and the inorganic passivation film 260 are etched to form contact holes so that portions of the drain electrode 250a, the source electrode 250b, and another gate electrode 215, which is a gate electrode of another thin film transistor, are exposed. A gate insulating film 220 of the gate electrode 215 is also etched. Subsequently, only the optical compensation inorganic film 290 corresponding to a portion of the cell drive unit is selectively removed to form an outgassing route 290a. The outgassing route 290a may be patterned so as to have different steps using a diffraction exposure mask or a half tone mask, and therefore, the outgassing route 290a may be selectively removed.

Figure 5C:
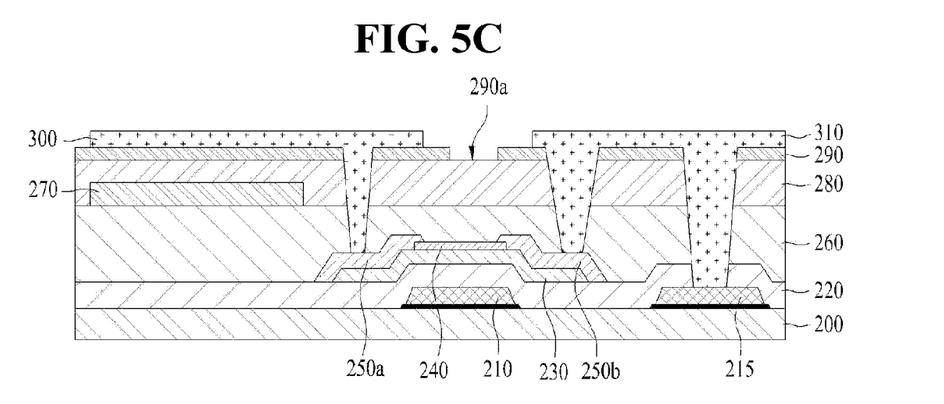

As shown in FIG. 5C, a first electrode 300 connected to the drain electrode 250a through a corresponding one of the contact holes and a connection electrode 310 interconnecting the source electrode 250b and the gate electrode 215 through corresponding ones of the contact holes are formed.

Figure 5D:
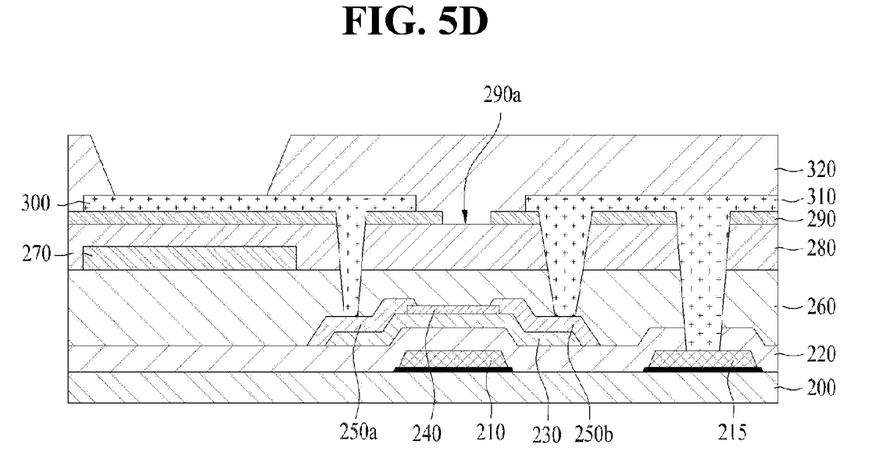

As shown in FIG. 5D, a bank forming material is applied to the front including the first electrode 300 and is selectively removed to form a bank 320 at the cell drive unit including the outgassing route 290a.

Figure 5E:
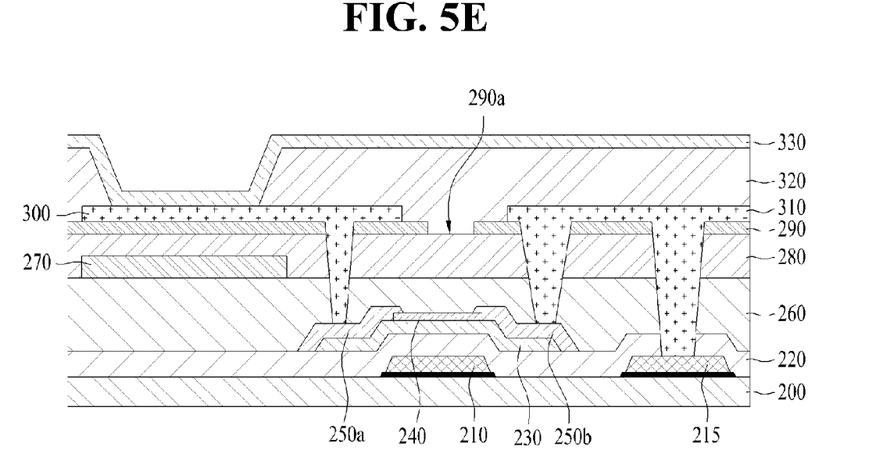

As shown in FIG. 5E, an organic light emitting layer 330 to emit white light is formed at the front including the bank 320.

Hole transport layers and electron transport layers may be further commonly formed on and under the organic light emitting layer 330. Also, the organic light emitting layer 330 may be obtained by vertically stacking different color light emitting layers to emit white light, or may be a single white light emitting layer to emit white light. In the former, the number of stacked light emitting layers may be 2 or more.

Figure 5F:
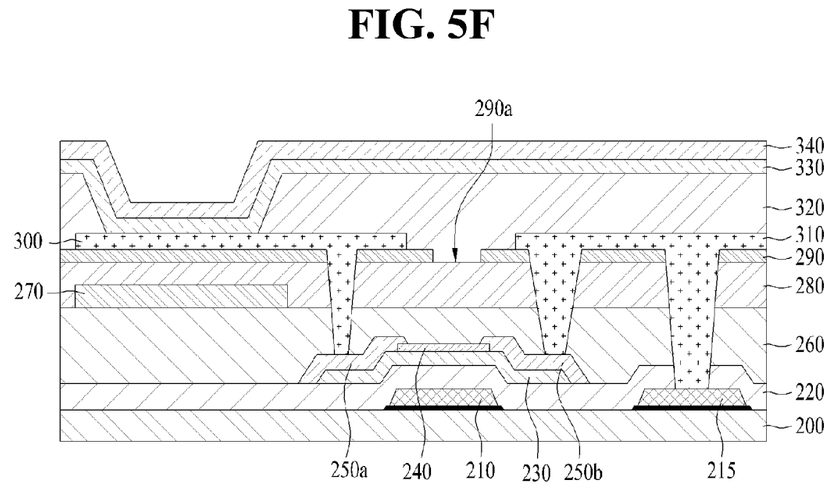

As shown in FIG. 5F, a metal is deposited on the organic light emitting layer 330 to form a second electrode 340.

In any of the embodiments, the organic and inorganic films are alternately formed, and a portion of the pattern is removed from the inorganic film corresponding to the cell drive unit to form the outgassing route. Consequently, gas is prevented from remaining in the organic film while the organic light emitting display device according to the present invention is driven for a long period of time, thereby preventing deterioration of the diode and, particularly, preventing shrinkage of the pixel unit due to the gas.

As is apparent from the above description, the organic light emitting display device and the manufacturing method thereof according to the present invention have the following effects.

In the organic light emitting display device according to the present invention, the organic and inorganic films are alternately formed, and a portion of the pattern is removed from the inorganic film corresponding to the cell drive unit to form the outgassing route, through which gas is released, particularly, from the organic film during a high-temperature process or operation for a long period of time. That is, when outgassing occurs due to a high-temperature process or operation for a long period of time, gas is prevented from remaining in the organic film, thereby preventing deterioration of the diode and, particularly, preventing shrinkage of the pixel unit due to the gas.

Also, the reduction in lifespan of the organic light emitting display device according to the present invention is prevented, thereby realizing a reliable device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising:
   a cell drive unit having a plurality of pixels on a substrate and comprising at least one transistor between the respective pixels;
   an insulating stack unit comprising an organic film and an inorganic film formed one above the other on the substrate in a region of the cell drive unit;
   wherein the inorganic film of the insulating stack unit corresponding to the cell drive unit is patterned to form an outgassing route, an upper surface of the organic film of the insulating stack unit having an over-etched portion defining a recess at a portion corresponding to the outgassing route;
   an organic light emitting diode connected to the cell drive unit through the insulating stack unit.

2. The organic light emitting display device according to claim 1, further comprising:
   a bank formed on the insulating stack unit in a region of the outgassing route.

3. The organic light emitting display device according to claim 2, wherein the bank contacts the organic film of the insulating stack unit through the outgassing route.

4. The organic light emitting display device according to claim 1, further comprising a further organic film, wherein the patterned inorganic film is arranged between the organic film and the further organic film, wherein the organic film and the further organic film contact each other through the outgassing route.

5. The organic light emitting display device according to claim 1, wherein the organic film of the insulating stack unit comprises any one selected from among a black matrix layer, a color filter layer, a planarization film, and an interlayer.

6. The organic light emitting display device according to claim 1, wherein the organic film of the insulating stack unit comprises at least one material selected from among polyimide, polyamide, acryl resin, color pigment material, and black resin material.

7. The organic light emitting display device according to claim 1, wherein the patterned inorganic film is patterned to form one or more outgassing routes in the same layer of the inorganic film.

8. The organic light emitting display device according to claim 1, further comprising: at least one further inorganic layer, wherein the inorganic layer and the further inorganic layer are patterned to form one or more outgassing routes in different inorganic films.

9. The organic light emitting display device according to claim 1, wherein the inorganic film of the insulating stack unit is formed of a nitride, oxide, or oxynitride.

10. The organic light emitting display device according to claim 1, wherein the organic light emitting diode comprises:
    a first electrode connected to the cell drive unit through the insulating stack unit so that the first electrode is formed at each of the pixels;
    an organic light emitting layer formed on the first electrode; and
    a second electrode formed on the organic light emitting layer.

11. A manufacturing method of an organic light emitting display device, comprising:
    forming a cell drive unit having a plurality of pixels in a matrix pattern and comprising at least one transistor between the respective pixels on a substrate;
    forming at least one insulating stack unit on the substrate in the region of the cell drive unit by stacking a first organic film and a first inorganic film one above the other;
    patterning the first inorganic film of the insulating stack unit corresponding to the cell drive unit to form a first outgassing route;
    forming a second organic film on the first inorganic film comprising the first outgassing route;
    forming a second inorganic film on the second organic film;
    patterning the second inorganic film to form a second outgassing route; and
    forming an organic light emitting diode connected to the cell drive unit through the insulating stack unit.

12. The manufacturing method according to claim 11, wherein the step of forming the insulating stack unit and the step of forming the outgassing route comprise:
    forming the first organic film on the substrate in a region of the cell drive unit;
    forming the first inorganic film on the first organic film; and
    patterning the first inorganic film corresponding to the cell drive unit to form a first outgassing route.

13. The manufacturing method according to claim 12, wherein, when the first inorganic film is patterned to form the first outgassing route, a thickness portion of the first organic film under the first inorganic film is over-etched.

14. A manufacturing method of an organic light emitting display device, comprising:

forming a cell drive unit having a plurality of pixels in a matrix pattern and comprising at least one transistor between the respective pixels on a substrate;

forming at least one insulating stack unit on the substrate in the region of the cell drive unit by stacking an organic film and an inorganic film one above the other;

patterning the inorganic film of the insulating stack unit corresponding to the cell drive unit to form an outgassing route, wherein, when the inorganic film is patterned to form the first outgassing route, a thickness portion of first organic film under the first inorganic film is over-etched; and forming an organic light emitting diode connected to the cell drive unit through the insulating stack unit.

15. The manufacturing method according to claim 14, further comprising forming a bank on the insulating stack unit in a region comprising the outgassing route.

16. An organic light emitting display device, comprising:

a cell drive unit having a plurality of pixels on a substrate and comprising at least one transistor between the respective pixels;

an insulating stack unit comprising a first organic film, a first inorganic film, a second organic film, and a second inorganic film formed one above the other on the substrate in a region of the cell drive unit;

wherein the first inorganic film of the insulating stack unit is patterned to form a first outgassing route, and the second inorganic film of the insulating stack is patterned to form a second outgassing route;

an organic light emitting diode connected to the cell drive unit through the insulating stack unit.

17. The organic light emitting display device according to claim 16, wherein the second organic film directly contacts the first organic film through the first outgassing route.

* * * * *